THIN FILM PRINTED ELECTRIC CIRCUIT

Filed March 7, 1963 6 Sheets-Sheet 1

3,460,105

THIN FILM PRINTED ELECTRIC CIRCUIT

David Edward Birt, West Ealing, London, Raymond Frank Sivyer, Sunbury-on-Thames, Middlesex, and Reginald Sidney Webley, Hayes, Middlesex, England, assignors to Electric & Musical Industries Limited, Hayes, Middlesex, England, a company of Great Britain Filed Mar. 7, 1963, Ser. No. 263,558

Claims priority, application Great Britain, Mar. 10, 1962, 9,328/62

Int. Cl. G11b 5/02

U.S. Cl. 340—174 7 Claims

ABSTRACT OF THE DISCLOSURE

The invention relates to multilayer printed circuits that is circuits in which conductors are provided adherent on a plurality of superimposed insulating supports. Conductors on different supports are selectively interconnected by virtue of apertures which are formed through one of the supports and at least some of the conductors on that support. Portions of the conductors on other supports, which extend beyond the insulating material of the respective supports are then passed through respective ones of said apertures. The invention is especially applicable to the manufacture of printed circuits such as are used in the formation of thin film magnetic stores. In such stores problems arise because of unwanted inductive coupling between parallel sets of conductors such as digit and sense conductors. To reduce this coupling a plurality of means are provided one for each digit conductor and the corresponding sense conductor to modify the coupling between them, said means being adjustable so that unwanted coupling can be minimised during the setting up of the store.

The present invention relates to printed circuits and has particular but not exclusive reference to constructional methods applicable to thin magnetic film storage devices. The invention also relates to thin film magnetic stores which can be produced by such methods.

In co-pending U.S. patent application No. 226,865 the manufacture of a thin magnetic film store is described, and the present invention comprises features which may most readily be applied to a store in accordance with the aforesaid application.

One object of the present invention is to provide an improved method of manufacturing an electrical circuit in which the connection of different sets of the conductors on different layers of the circuit can be made simply and accurately.

A further object of the present invention is to provide an improved thin film magnetic store having conductors for inducing or sensing magnetisation changes in the elements of the store, said conductors being provided in the form of multilayer printed circuits.

According to one feature of the invention there is provided a printed electrical circuit comprising three or more sets of conductors, each set adherent to insulating material individual to that set, apertures in at least some of the conductors of a first set and the corresponding portions of the insulating material of that set, and portions of conductors of the second and third sets which extend beyond the insulating material of those sets and pass through respective ones of said apertures.

According to another feature of the invention there is provided a storage arrangement including thin film magnetic material disposed on supporting means and forming storage elements, a plurality of digit conductors disposed so as to be magnetically coupled to respective sets of said storage elements, and a plurality of sense conductors corresponding respectively to said digit conductors and disposed so as to be magnetically coupled with the respective sets of storage elements, wherein the inductive coupling between each of said digit conductors and the corresponding sense conductor is in opposite senses in different parts of the arrangement so as to reduce the overall coupling therebetween, characterised in that a plurality of means are provided one for each digit conductor and the corresponding sense conductor to modify the coupling therebetween, which means are adjustable so that the couplings between the digit conductors and corresponding sense conductors can be further reduced, or which means have been adjusted so that the couplings between the digit and corresponding sense conductors are further reduced.

Figure 1:
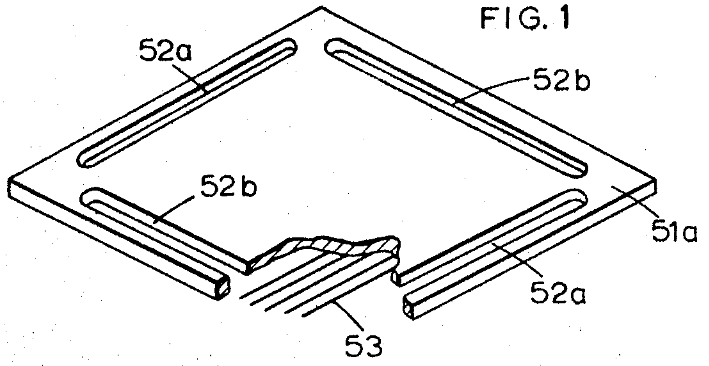
Figure 2:
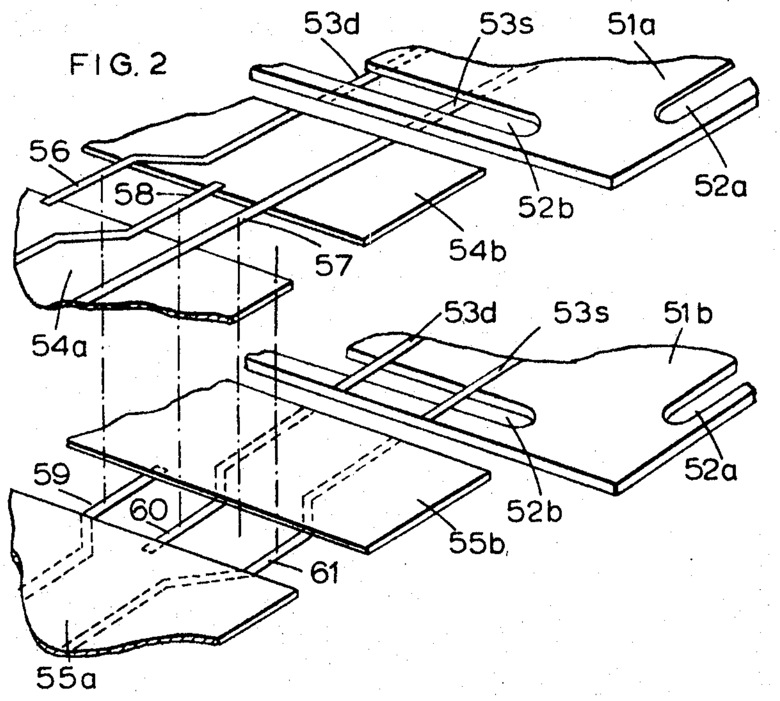
Figures 3, 4, 7:
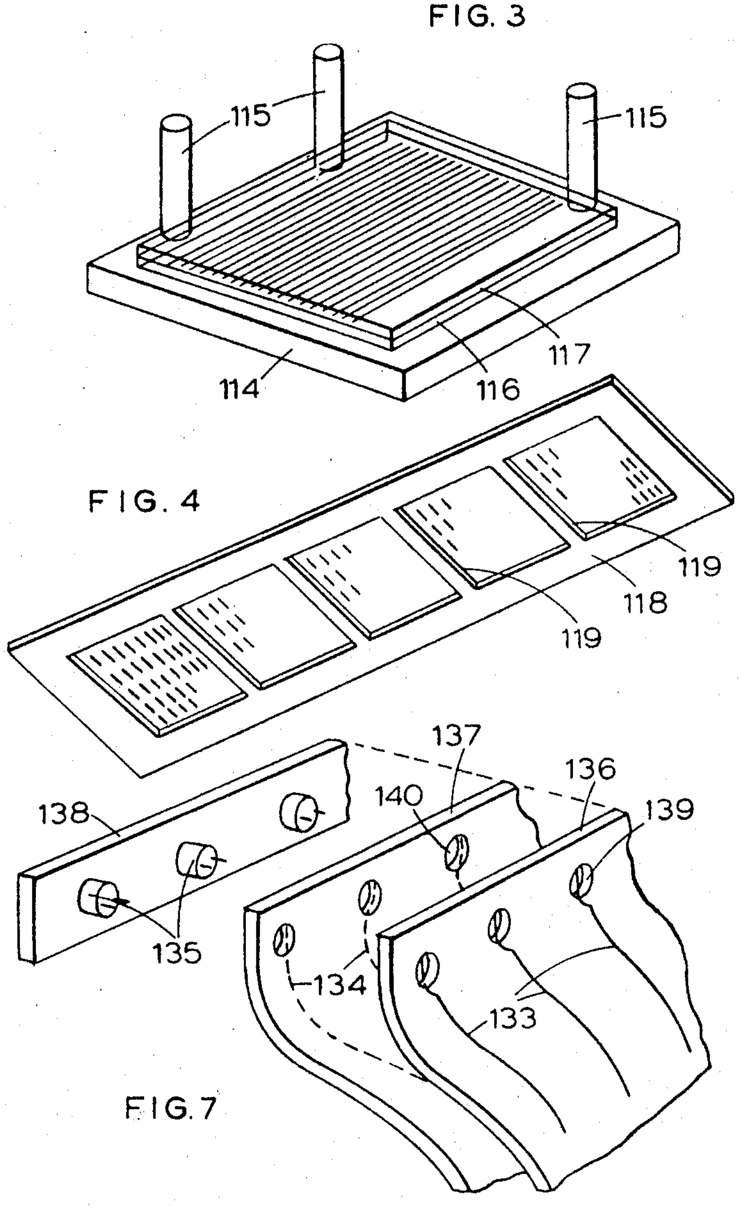
Figure 5:
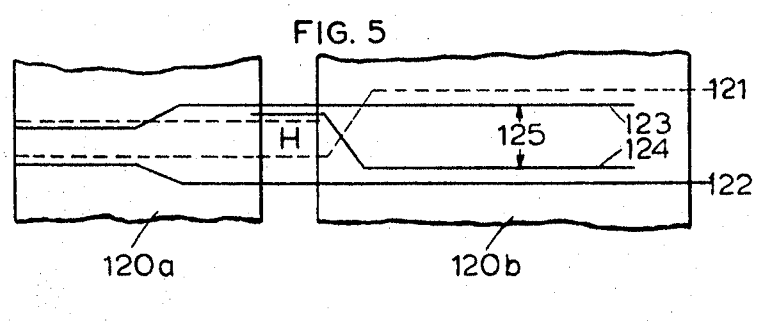
Figure 6A:
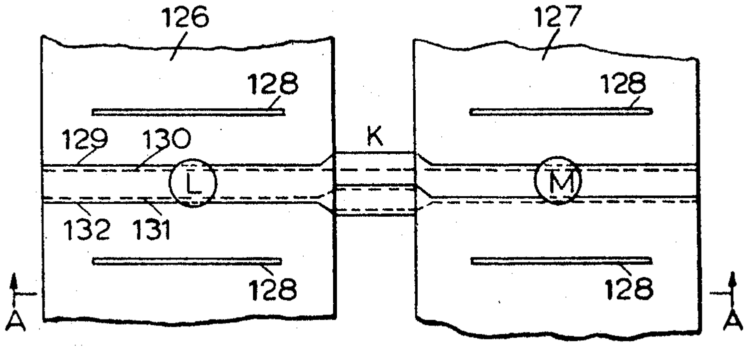
Figure 6B:
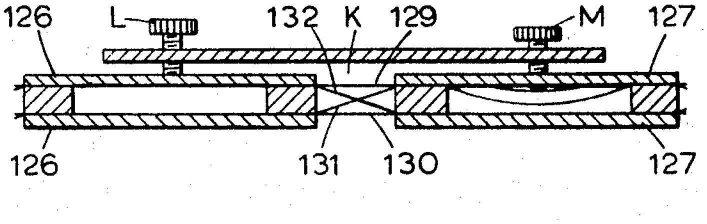
Figure 8:
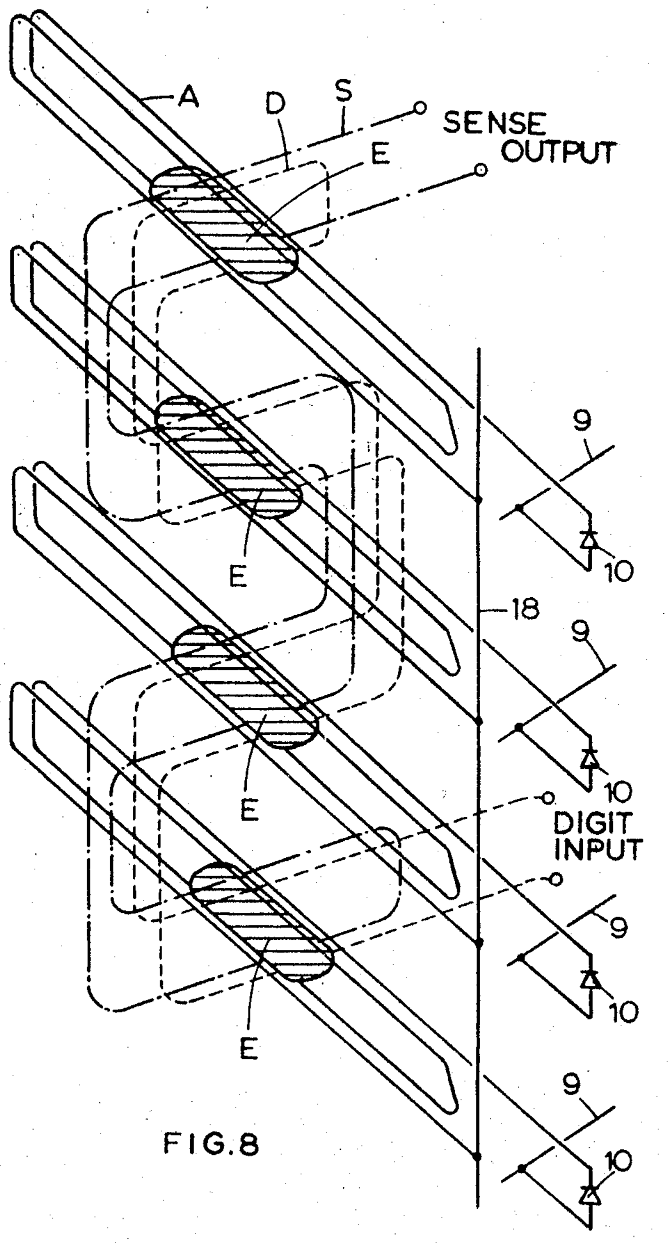
Figure 9:
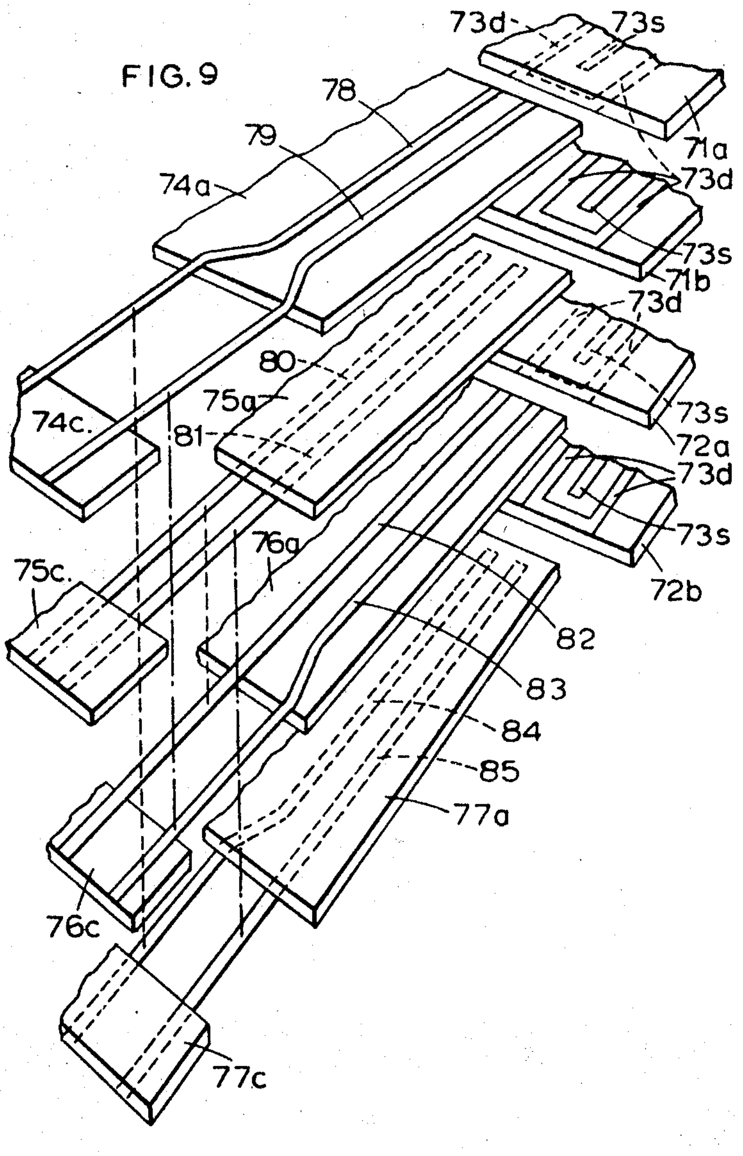
Figures 10, 11:
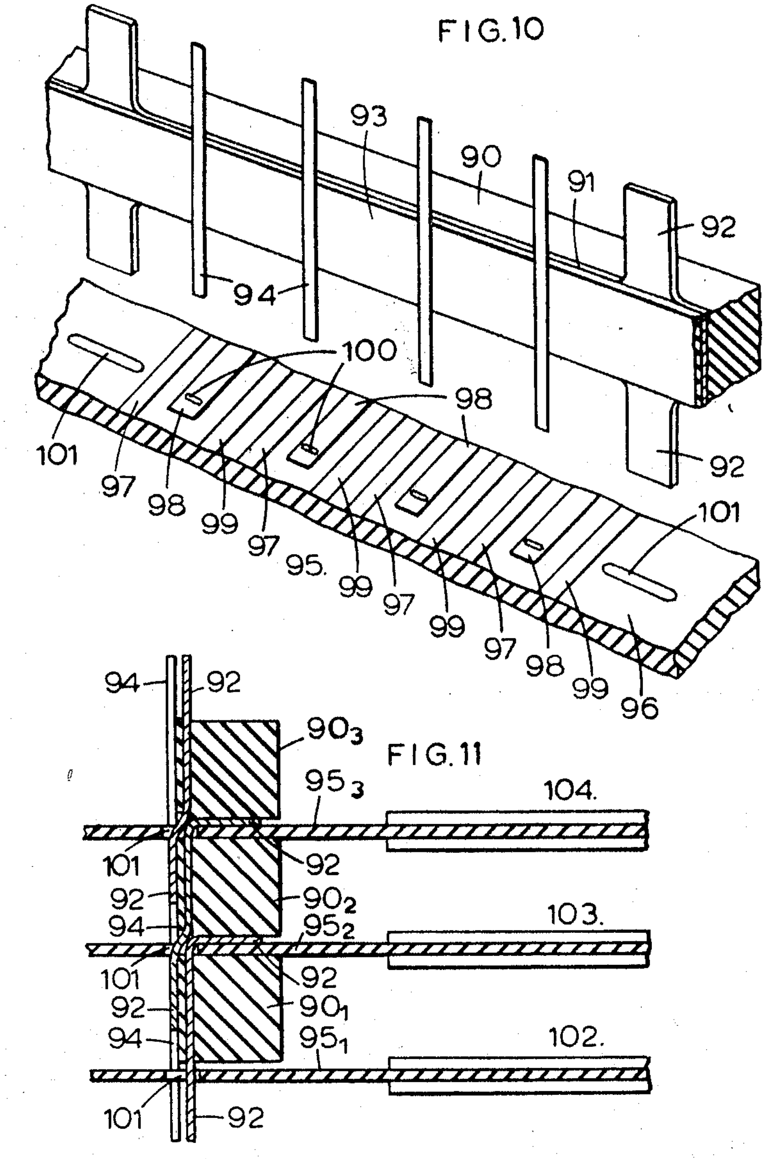

In order that the invention may be clearly understood and readily carried into effect, it will now be more fully described with reference to the accompanying drawings in which:

FIGURE 1 shows the arrangement of a printed circuit board in accordance with one embodiment of the present invention, FIGURE 2 illustrates a method of making connections to board similar to that shown in FIGURE 1, FIGURE 3 shows a jig for preparing pairs of printed circuit boards with considerable accuracy of mutual registration, FIGURE 4 shows an evaporation mask suitable for preparing areas of thin magnetic material which will register accurately with the conductive portions of a completed store, FIGURE 5 illustrates one method of balancing out residual coupling between the digit and the sense conductors in a thin magnetic film store, FIGURE 6*a* shows in plan view another method of adjusting the coupling between digit and sense conductors, FIGURE 6*b* shows a section of FIGURE 6*a* at station A—A, FIGURE 7 illustrates another method of connecting input and output leads to printed circuit boards in accordance with one embodiment of the invention, FIGURE 8 is a phantom diagram showing the organisation of the address, digit and sense wires in relation to four corresponding magnetic storage elements, one element on each of four planes of a thin film store, FIGURE 9 illustrates a form of circuit which may be used for connecting digit and sense wires on different planes of a store, FIGURE 10 illustrates an arrangement of circuits for screening and bringing out connections from the address wires of a store, and FIGURE 11 is a diagrammatic cross sectional view illustrating how circuits shown in FIGURE 10 are arranged for different planes.

In order to give a general picture of a store, the construction of which is given in co-pending U.S. patent application No. 226,865 reference will first be made to FIGURE 8. The complete store described in the above application comprises two hundred and fifty-six rows of magnetic elements sixty-four rows to each plane, and there are fifty elements in each row. Each row of elements provides storage capacity for one word, the store being a word organised store in which each address winding is coupled with a row of magnetic elements. Four of the magnetic elements are represented in FIGURE 8 being denoted in that figure by the general reference E and the elements which are represented are corresponding elements of the four different planes of the store. Each of the elements is associated with a two-turn address winding A connected at one end to a vertical bus-bar 18 (which is common to the four planes) and connected at the other end to a horizontal bus-bar 9 via a diode 10. There are two horizontal bus-bars 9 for each plane although only one is shown in FIGURE 8 and each vertical bus-bar is common to two address windings. There is a separate address winding A for every row on each plane and there are thirty-two vertical bus-bars 18 and four pairs of horizontal bus-bars 9. A particular row (word location) in any one plane can be addressed by applying an appropriate potential difference between a selected vertical bus-bar and a selected horizontal bus-bar.

Each of the elements is also associated with two further windings, namely a digit winding D and a sense winding S. These windings are associated with the magnetic elements in columns, and the same sense and digit windings couple with corresponding columns in the four planes. There are therefore fifty digit windings D and fifty sense windings S each of which zig-zags from one plane to the next as represented in the case of one each of the windings S and D in FIGURE 8. FIGURE 8 thus indicates the configuration of four address windings A, a single digit winding D and a single sense winding S. The magnetic elements E are in the form of discrete thin magnetic film elements which exhibit a preferred magnetic axis. They are roughly rectangular in shape having their longer dimensions aligned in the direction of the rows as indicated in FIGURE 8. The magnetic anisotropy is such as to produce a characteristic hysteresis loop which ideally approximates to a rectangle along axes which are aligned with the rows of the store, and substantially no hysteresis along axes aligned with the columns. In the wiring arrangements about to be described, each digit winding is composed of two parallel conductors lying respectively at opposite sides of the conductor which constitutes the respective sense winding but in order to simplify FIGURE 9, only one of the digit conductors is shown.

The mode of operation of the store such as has been briefly described is well known to those skilled in the art, and will not be considered. The conductors required to form the address, digit and sense windings are provided predominantly in the form of printed conductors or "wires" as they are hereinafter termed for simplicity, the term "printed conductor" or "printed wire" being used to denote a conductor which is adherent to the surface of insulating supporting means. Such an adherent conductor can be produced by a variety of known methods for forming printed circuits and the invention is not in any way restricted to the method used for providing adherent conductors and such methods as are indicated in this specification are merely methods which are preferred for the particular conductors under consideration.

Some of the printed circuits which are used comprise conductors which bridge a gap between two portions of insulating material to which the conductors adhere, whereby wholly exposed portions of the conductors are provided at the gap. Printed circuits such as these are used as will appear to facilitate the establishment of the multiple electrical connections which are required in the manufacture of the store. Such printed circuits are in some cases referred to as "ladders" in the following description, the bridging conductors forming "rungs" of the ladders. The may be made in any suitable manner, for example by securing copper foil to two portions of insulating material by means of an adhesive so that the foil bridges a gap between these two portions, etching away unwanted portions of the copper foil to leave only the portions required to form the desired conductors and (if desired) increasing the thickness of the conductors by electro-deposition onto them. During the etching and possibly also during the electro-deposition the copper foil bridging the gap may be supported by a temporary insulating support fitted into the gap in the insulating material and having if desired the surface nearer the copper foil coated with release agent. Temporary support provided in this way is especially desirable if the insulating material to which the copper foil adheres is in the form of a relatively thick plate of insulating material, say glass, but may be unnecessary if the insulating material is in the form of thin flexible sheet material, say resin-impregnated fibre glass. As will appear moreover the two portions of insulating material at the sides of the gap bridged by the adherent conductors may be separate portions, or may be portions of a single plate or sheet, or board, the gap in this case being in the form of a slot.

With reference to FIGURES 1 and 2 of the accompanying drawings reference numeral **51*a* indicates a board of insulating material upon which is applied the desired pattern of conductors. Portions of the digit and sense conductors are denoted by the general reference 53. Pairs of boards 51*a* and 51*b* are assembled together with the conductors facing inwards towards one another as shown in FIGURE 2. The method of preparing the boards with the appropriate conductors may be by any means well known in the art, but a preferred method is to pre-coat copper sheet with dry adhesive, apply a resist agent to the coated side of the sheet other than where the slots will be, removing adhesive in the areas of the slots, for example with chromic acid or other suitable adhesive solvent, and then remove the resist agent with another suitable solvent such as acetone. The boards in the present embodiment are formed of glass-fibre reinforced synthetic resin, and the prepared sheet of copper is bonded to the board before being etched in conventional manner to the pattern of conductors required, the pattern being first obtained by printing onto a photo-resist layer from a negative. During printing and etching, the copper over the slots 52*a*, 52*b* is temporarily supported as hereinbefore described. As will at once be apparent to one skilled in the art, for use in a store such as the thin magnetic film store disclosed in the above mentioned co-pending application, a second pattern of conductors will be required at right angles to those illustrated in FIGURES 1 and 2. This is provided by bonding a thin sheet of insulating material between the board 51*a* or 51*b* and a sheet of conductive material which will extend beyond the thin sheet of insulating material in the vicinity of slots 52*a*.** The conductive pattern will be formed after bonding, in the same way as the first layer.

FIGURE 2 shows the method of interconnecting the pair of boards **51*a* and 51*b*** of a store with subsequent pairs of boards, each pair of boards constituting a memory plane when assembled with the magnetic material E as in FIGURE 8.

Thin flexible sheets of polytetra-fluoroethylene or of glass fibre reinforced synthetic resin **54*a*, 54*b* and 55*a*, 55*b* are provided with conductors 56, 57 and 58 and 59, 60 and 61 respectively, these conductors being representative of a large number of similar conductors which are disposed along the full length of sheets 54 and 55. The conductors 56 to 61 bridge gaps between the sheets 54*a* and 54*b*, 55*a* and 55*b* to form ladders as shown. This length is sufficient to cover the full pattern of conductors along the appropriate edge of boards 51*a*, 51*b*. Sheets 54*a* and 55*a* and 54*b* and 55*b* may be bonded together and are inserted between the boards 51*a* and 51*b* so that conductors 56 and 57 are accurately aligned with conductors 53*d* and 53*s* respectively on the upper board 51*a*, with the inner edge of the parts 54*a* inserted at least to the inner edge of the slot 52*b*. Conductors 60 and 61 on sheet 55*b* will then be found to align with conductors 53*d* and 53*s* in the lower board 51*b*. The conductors are coated, during manufacture so that the application of heat through slots 52** will cause the conductors which are aligned to become soldered together.

It will now be found that in the gap between the sections **54*a* and 54*b* and the corresponding gap between the sections 55*a* and 55*b*, conductors 56 and 59 and 58 and 60 will be aligned whereas conductors 57 and 61 will fall as illustrated into the gaps between adjacent conductors. If conductors 56 and 59 and 58 and 60 are soldered together the correct reversal of the digit or sense winding in the completed store will be ensured. An advantage of this method of construction is that pairs of boards are assembled side by side and may then be folded at the gap between the sheets 54***a* and 54*b*, 55*a* and 55*b* into the final form of the store.

Only one digit wire is shown in FIGURES 1 and 2 associated with each sense wire, but two digit wires may be provided, one on each side of the respective sense wire.

The modifications illustrated in FIGURE 9 affect the printed connecting circuits for connection of the digit and sense wires and they bear some resemblance to the printed circuits illustrated in FIGURE 2 but the circuits do not need to be folded during assembly. By avoiding the folds the amount of inductive coupling between sense and digit windings is further reduced. In FIGURE 9 four plates of insulating material 71*a*, 71*b*, 72*a* and 72*b* are shown carrying the digit and sense wires for two planes of a store which is similar in general construction to that described in the above mentioned co-pending application. One triad of digit and sense wires is represented on each of the plates, the digit wires bearing the reference 73*d* and the sense wires bearing the reference 73*s*. As indicated the two digit wires of a triad are connected together at the edges of the plates by short printed conductors. The connecting circuits shown are formed by two pairs of printed ladders. The insulating material of the topmost ladder is denoted by the references 74*a*, 74*c* and the insulating material of the other ladders also bear the references 75, 76 and 77 but with appropriate suffixes. Each ladder has two conductors for each triad which are respectively above and below the insulating material when the ladders are positioned for connection. The two upper ladders seen in FIGURE 9 may be bonded together and are inserted between the plates 71*a* and 71*b* whilst the two lower ladders similarly bonded together if desired, are inserted between the plates 72*a* or 72*b*. The conductors 78 and 79 on the topmost ladder adhering to the insulating portion 74*a* are joined to one digit wire and one sense wire on the plates 71*a*, the join being effected by a soldering through a slot on the plate 71*a*, which slot is not shown but is similar to the slot 52*a* in FIGURE 1. When the upper ladder is inserted between the plates 71*a* and 71*b* it is necessary to insulate the connection between the two digit wires 73*d* on the plate, otherwise that connection would short circuit the sense wire 73*s* to the digit wires 73*d* via the connector 79 on the ladder. The insulation is effected by applying a strip of insulating material on the plates 71*a* and 71*b* so as to cover the connections in question. In the same way, the conductors 80 and 81 on the second ladder, 82, 83 on the third ladder and 84, 85 on the fourth ladder are joined to the digit and sense wires on the plates 71*b*, 72*a* and 72*b*. As shown, it is the left hand digit conductor to which the connection is made in all cases. Connections are then made between the conductors of the ladders at the gaps which are of the left side of FIGURE 9, a suitable support being first placed under the conductors where they bridge the gap. The formation of the conductors on the ladders is such that 78 registers with and is joined to 84, 79 registers with and is joined to 83, 80 registers with and is joined to 82, and 81 registers with and is joined to 85. It will be seen that when these connections are made there is a cross over in the digit wires between planes but not in the sense wires. When the conductors 78 and 85 have been soldered together as described, the outermost portions of insulating material on the ladders, namely 74*c* to 77*c* may be cut away, if desired. However during the soldering, the portions of the conductors 78 to 85 adhering to those insulating portions 74*c* to 77*c* can be used as terminals for applying test signals.

The input and end connections for the digit and sense windings can also be made by printed winding circuits like those illustrated in FIGURES 2 and 9 as appears from FIGURE 6.

According to FIGURES 10 and 11 there are provided for each plane of the store a horizontal bar 90 of insulating material which extends across the full width of the store. A conductive foil 91 adheres to the outer face of the bar and is provided with lugs 92 which project both upward and downward from the bar. The conductive foil forms a screen. An insulating film 93 is deposited on top of the conductive foil 91 (not however covering the lugs 92) and on this film 93 adhere vertical conductors 94 there being four such conductors between two adjacent pairs of lugs 92. The address wires for each plane of the store are brought out from the plates on which they are printed by further printed circuits, part of one of which is represented by the reference 95. This circuit comprises an insulating board 96 on which are printed a series of conductors which it is convenient to regard as being grouped in threes each group comprising conductors 97, and 98 and 99 respectively. There are four such groups of three conductors, one group to each two address windings on the corresponding plane of the store. Thus the conductor 97 is connected to the output of a first of a pair of address windings, the conductor 98 is connected to the output of the first and to the input of the second address winding, and the conductor 99 is connected to the output of the second address winding. The terms "input" and "output" are here used for convenience only, and it must be understood that current always flows out to the vertical bus bars 98. The connection in the case of FIGURE 10 can be made by means of ladders similar to those illustrated in FIGURE 9 which may indeed as part of the circuit 95. The conductors 97 and 99 continue to the front of the insulating board for connection to other conductors (not shown) which are printed on the board 96 to complete the connections from diodes via resistors to the horizontal bus-bars of the complete store. These bus-bars have, also, not been shown in FIGURE 10 but are printed on insulating strips which run across and on top of the conductors 97 and 99.

The insulating board 96 has holes 100 which also penetrate the conductors 98 and through which may be passed the vertical conductors 94, and has further holes 101 for the passage of lugs 92. When assembling the store the bars 90 and circuits 95 are arranged as shown in FIGURE 11, successive bars 90 and circuits 95 being distinguished by suffixes 1, 2, etc. The appropriate connections of the circuit 95 to the address wires of the lowest plane (denoted 102 in FIGURE 11) are made, the conductors 94 and the lugs 92 of the lowest bar $90_1$ are threaded through the respective holes 100 and 101 in the circuit 95, and the conductors 94 are then soldered to the conductors 98 at the holes 100. The second plane 103 of the store is now assembled in position, and the connections to the respective circuit $95_2$ are made. The upstanding lugs 92 and the upstanding parts of the conductors 94 of the lowest bar $90_1$ are threaded upwards through the holes 100 and 101 of the second circuit $95_2$ and then folded down on top of the circuit $95_2$. The next bar $90_2$ is positioned as indicated, with the down-projecting lugs 92 and conductors 94 passing through the holes 100 and 101 on the second circuit $95_2$. They are then soldered underneath to the lugs 92 and conductors 94 of the lowest bar $90_1$. This process is repeated to the top plane of the store, and when the assembly is completed the screen formed by the foil 91 is continuous except where penetrated by the circuits 95, and similarly the vertical bus bars formed by the conductors 94 are continuous.

The store construction described requires pairs of plates or boards on which the conductors of one plate faithfully correspond with those of the other plate.

FIGURE 3 illustrates a jig from which accurately registered conductors may readily be produced for pairs of boards. A transparent base plate 114 is provided with three pillars 115 which accurately define the position of two sheets of transparent material 116 and 117. If the sheets 116 and 117 are identified so that they may be inserted into the jig in only one direction then positive location is assured by the three pillars 115. In order to construct the composite negatives required for the production of the boards sheet 116 is first placed in the jig and then upon it is laid the negative required for producing the upper board. When the position of this negative is accurately obtained on the plate 116 it is then secured by means of a strong adhesive. The negative for preparing the lower board of the pair is then placed upon the first negative, the emulsion layers being in contact accurately aligned optically with the first negative under a microscope, and secured thereto with an adhesive which may be subsequently broken.

Plate 117 may now be placed upon the second negative and secured thereto by a strong adhesive, the same adhesive as was used for affixing the first negative to plate 116 being suitable. When the adhesive has hardened the two plates 116 and 117 with their associated negatives may be now broken apart at the breakable adhesive. If a prepared upper board is now placed with its lower surface in contact with the negative attached to the plate 116 while in the jig and exposed from below and then a prepared lower board is placed in the jig with its upper surface in contact with the negative attached to plate 117 and exposed from above, then the pattern of the conductors on the upper board and the pattern of the conductors on the lower board inevitably register with the accuracy with which the negatives were originally aligned. Clearly this principle may be extended in order to produce conductors at right angles to the first conductors and hence extremely accurately aligned pairs of boards will result.

In order to ensure that the magnetic elements in the store are accurately located under the appropriate conductor junctions, positives made from the negatives used in the jig shown in FIGURE 3 are used to prepare negatives of copper weakly bonded to a base material. The parts of the copper negatives which are not required are manually removed by peeling. For example, in the case of the address conductors in the store, these will be arranged in pairs and the unwanted copper strip in the copper negative between the pairs may be so removed. Similar treatment is given to the digit and sense negative by removing the two copper strips between the three conductors comprising two digit and one sense conductors. The two copper negatives can now be assembled in a jig into a composite copper negative from which first a positive and then a negative film is made. This film is subsequently used for preparing an evaporation mask 118 such as shown in FIGURE 4. The mask 118 is made from meetallic material which is first annealed to avoid distortion which would otherwise arise from relief of strain when it is subsequently etched. Windows 119 are etched in known manner from the rear of the mask 118 in order to leave a relatively thin sheet of material within the windows which may be etched through from the other side without resulting in undue undercutting. The final etching of the apertures in the windows 119 will be made in known manner through a photo-resist which has been exposed under a composite negative produced as described above. The magnetic elements may now be evaporated onto a suitable substrate such as glass and may then be coated with silicon monoxide in order to give additional mechanical and chemical protection. Alternatively, in some cases the magnetic elements may be evaporated on to a metal substrate coated with insulating material. It will be appreciated that the digit-sense cross over which occurs between planes causes the sense of any direct inductive coupling between the digit and sense conductors to have reversed senses in alternate planes, so that the resultant coupling is relatively small.

In a completed store it is desirable to make some arrangement of adjustable coupling in the digit and sense wiring so that the pulse induced in the sense loop when the digit current flows and which is not completely cancelled by the digit/sense crossover arrangement can be reduced to negligible proportions. FIGURES 5 and 6A and 6B illustrate two such devices. With reference to FIGURE 5, 120*a* is a portion of flexible glass fibre reinforced synthetic resin sheet composed for example of two layers 54*a* and 55*a* such as illustrated in FIGURE 2 which is inserted between the pair of boards of the completed store to which the digit input is to be applied. A sheet 120*b* of similar material and comprising for example layers 54*b* and 55*b* such as illustrated in FIGURE 2, is connected to sheet 120*a* by means of the printed conductors 121 to 124 upon the sheets 120*a* and 120*b*, the conductors indicated by dotted lines in the figure lying underneath the sheets. Conductors 121 and 122 are connected to the digit conductors and conductors 123 and 124 are connected to the sense conductors, a crossover H being arranged by the connection of sense conductor 124 on the upper face of sheet 120*b* with the sense conductor 124 on the upper face of sheet 120*a*. During testing of the store a temporary connection 125 is made between conductors 123 and 124 on sheet 120*b* to complete the sense loop and its position is adjusted to give minimum coupling between that sense loop and the adjacent digit loop. The temporary connection 125 is then replaced with a permanent connection which may be of solder. At the other end of the store a similar arrangement is used to complete the digit loop. The position of the connection at the end of the digit wiring being chosen to provide sufficient latitude for adjustment by the completion of the sense loop consistent with keeping both sense and digit winding inductances to a minimum.

An alternative arrangement is illustrated in FIGURE 6 comprising views 6*a* and 6*b* and is largely self-explanatory. A pair of boards 126, forming one plane of the store and another pair of boards 127 are clamped together with gaps between each pair and due to the cross-over of the conductors at point K signals on the pair of boards 126 are out of phase with signals on the pair of boards 127. The gaps between the pair of boards 126 and the pair of boards 127 when assembled may be reduced by either screw adjustor L or screw adjustor M which are screwed through the same fixed support and are arranged to flex each board in the area between the slots 128 in order to provide the desired cancellation.

In making connections to the input and output sockets of the store an arrangement as shown in FIGURE 7 is advantageous as by this means lengths of unsupported conductors are avoided. The input or output conductors 133 and 134 are printed onto flexible plastic sheets 136 and 137 which are then bonded together with the conductors on the outside of the composite sheet thus formed as illustrated in FIGURE 7. Short lengths of the conductors 133 and 134 are arranged to pass almost entirely across the holes 139 and 140 in sheets 136 and 137 in the form of tabs which may be soldered to the pins of appropriate sockets 135 which are mounted on a support 138. If the support 138 is rigidly fixed to the main frame of the completed store then the whole store can be inserted into a case which is provided with plugs mating with the sockets 135. In this manner a relatively rigid and positive connection can be made between the store and its ancillary equipment. A similar arrangement to that shown in FIGURE 7 may be used for mounting diodes into the completed store and in this case pairs of sheets corresponding to sheets 136 and 137 may be flexed apart from adjacent pairs of sheets in the assembled store to expose the joints between the conductors and the diode leads more fully, thus rendering operation of replacing unserviceable diodes easier.

A further modification to the construction of a store such as that described in the above cited co-pending application which bears some resemblance to the arrangement of FIGURES 10 and 11 is proposed in that vertical busbars connecting boards at different vertical levels are passed through holes in the boards, the holes being located beneath the particular tinned conductors which it is desired to connect. Tinned vertical bus-bar wires are then forced through the holes which tears the conductor approximately radially round the hole so that substantially V-shaped pieces are arranged around each hole. If a current is then passed through the bus-bar sufficient heat is produced to cause fusion of the tin on the conductors with that on the bus-bar.

In a store modified in accordance with the preceding arrangement, it is proposed to attach the diodes in the address wiring in the centre of the address loops. A result of this arrangement is that a need arises for a damping resistance across each half loop of the address wiring, whereas in the previous store in accordance with the aforesaid application, a single damping resistance across the whole address loop is needed. In order to accommodate this resistance it may conveniently take the form of a proprietary conducting paste applied to the sheets carrying the address connections making contact with one conductor. The boards are arranged to be lengthened in the address direction so that when the sheets are inserted between the boards, the conducting paste makes contact with a conductor on the board, so that a resistive connection between the conductor on the sheet and the conductor on the board is achieved.

In the present invention, and especially in FIGURES 2 and 9, the use of plates or sheets of insulating material which are provided with a pattern of conductors on one side and subsequently bonded together may be avoided by the use of single plates printed on both sides. In this arrangement the temporary support in the area of slots or discontinuities of the insulating material is conveniently provided by the application of a lacquer which may be subsequently removed with a solvent.

The present modifications are in no way limited in their application to thin magnetic film stores and may clearly be applied to other forms of printed circuitry by one skilled in the art.

What we claim is:

1. A printed electrical circuit comprising three or more sets of conductors, each set adherent to insulating material individual to that set, apertures in at least some of the conductors of a first set and the corresponding portions of the insulating material of that set and portions of conductors of the second and third sets which extend beyond the insulating material of those sets and pass through respective said apertures.

2. A printed electrical circuit in accordance with claim 1 in which said second or third set of conductors comprises a single conductor which is arranged to provide an electrical screen.

3. A storage arrangement including thin film magnetic material disposed on supporting means and forming storage elements, a plurality of digit conductors disposed so as to be magnetically coupled to respective sets of said storage elements, and a plurality of sense conductors corresponding respectively to said digit conductors and disposed so as to be magnetically coupled with the respective sets of storage elements, wherein the inductive coupling between each of said digit conductors and the corresponding sense conductor is in opposite senses in different parts of the arrangement so as to reduce the overall coupling therebetween, characterised in that a plurality of means are provided one for each digit conductor and the corresponding sense conductor to modify the coupling therebetween, which means are adjustable so that the couplings between the digit conductors and corresponding sense conductors can be further reduced, or which means have been adjusted so that the couplings between the digit and corresponding sense conductors are further reduced.

4. A storage arrangement according to claim 3 wherein said supporting means comprises a plurality of planar supports, and said conductors include straight portions parallel to surfaces of said supports.

5. A storage arrangement according to claim 4 wherein said planar supports are of substantially the same size, there is an even number of said supports and with respect to the digit conductors the sense conductors on half of said supports are reverse looped relative to those on the other half of said supports.

6. A storage arrangement according to claim 5 wherein said modifying means comprise for each sense conductor two devices coupling the sense conductor to the corresponding digit conductor one device providing coupling in the opposite sense to the other device.

7. A storage arrangement according to claim 6 wherein each said device provides an adjustable inductive coupling between the respective sense and digit conductors.

References Cited

UNITED STATES PATENTS

| | | | |
|---|---|---|---|
| 3,052,823 | 9/1962 | Anderson et al. | 200—11 |
| 3,098,951 | 7/1963 | Ayer et al. | 174—68.5 |
| 3,228,093 | 1/1966 | Bratton | 174—68.5 |
| 3,293,620 | 12/1966 | Renard | 340—174 |
| 3,053,929 | 9/1962 | Friedman | 174—68.5 |

BERNARD KONICK, Primary Examiner

S. POKOTILOW, Assistant Examiner

U.S. Cl. X.R.

174—68